United States Patent
Arcidiacono et al.

(10) Patent No.: US 11,626,880 B2
(45) Date of Patent: Apr. 11, 2023

(54) CONTROL CIRCUIT AND CORRESPONDING METHOD

(71) Applicant: STMicroelectronics S.r.l., Agrate Brianza (IT)

(72) Inventors: Liliana Arcidiacono, Tremestieri Etneo (IT); Alessandro Nicolosi, Dresano (IT); Valeria Bottarel, Novara (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 9 days.

(21) Appl. No.: 17/450,711

(22) Filed: Oct. 13, 2021

(65) Prior Publication Data

US 2022/0149844 A1 May 12, 2022

(30) Foreign Application Priority Data

Nov. 6, 2020 (IT) ........................ 102020000026530

(51) Int. Cl.
*H03K 19/17736* (2020.01)
*H03K 19/08* (2006.01)

(52) U.S. Cl.
CPC ..... *H03K 19/1774* (2013.01); *H03K 19/0813* (2013.01); *H03K 19/17744* (2013.01)

(58) Field of Classification Search
None
See application file for complete search history.

(56) References Cited

U.S. PATENT DOCUMENTS

| 9,280,509 | B2 | 3/2016 | Yang | |
|---|---|---|---|---|
| 10,277,228 | B1* | 4/2019 | Buch | G01R 31/275 |
| 2005/0102545 | A1* | 5/2005 | Clavequin | G06F 1/10 |
| | | | | 713/401 |
| 2007/0200597 | A1* | 8/2007 | Oakland | G06F 1/10 |
| | | | | 326/46 |
| 2009/0100283 | A1* | 4/2009 | Ludewig | G06F 1/12 |
| | | | | 713/375 |
| 2015/0256329 | A1 | 9/2015 | Cheong et al. | |

OTHER PUBLICATIONS

Ozalevli, Erhan, "A Compact One-Pin Mode Transition Circuit for Clock Synchronization in Current-Mode-Controlled Switching Regulators", IEEE Transactions on Very Large Scale Integration (VLSI) Systems, vol. 24, No. 9, Sep. 2016, pp. 2960-2969.

* cited by examiner

*Primary Examiner* — Jany Richardson
(74) *Attorney, Agent, or Firm* — Slater Matsil, LLP (57) ABSTRACT

A circuit receives an input signal having a first level and a second level. A logic circuit includes a finite state machine circuit, an edge detector circuit, and a timer circuit. The finite state machine circuit is configured to set a mode of operation of the circuit. The edge detector circuit is configured to detect a transition between the first and second level. The timer circuit is configured to determine whether the first or second level is maintained over an interval, which starts from a transition detected by the edge detector circuit. The finite state machine circuit is configured to change the mode of operation based on the timer circuit determining that the first or second level has been maintained over the interval.

20 Claims, 7 Drawing Sheets

CONTROL CIRCUIT AND CORRESPONDING METHOD

CROSS-REFERENCE TO RELATED APPLICATIONS

This application claims priority to Italian Application No. 102020000026530, filed on Nov. 6, 2020, which application is hereby incorporated by reference herein in its entirety.

TECHNICAL FIELD

The present disclosure generally relates to control logic for electronic circuits and, in particular embodiments, dynamically managing via a single pin two different modes of operation for a device and an external clock.

BACKGROUND

Some types of electronic devices can support two different modes of operation. Synchronization with a clock signal generated by an external master clock may be desired for one or both of these modes.

For example, switching DC-DC converters can function in a low-consumption mode (e.g., burst switching) and a low-noise mode (e.g., constant switching). A synchronization signal can be provided for the latter mode by an external clock signal applied to a pin in the device that can recognize the signal frequency.

In packages with a limited number of pins, either one of the possible modes of operations can be chosen with a different "part number" defined for each mode, or a "pin strapping" function may be provided, which sets the mode of operation at device startup so that the same pin can be used for other functions in the steady-state.

Furthermore, if the mode selected provides for possible synchronization with an external clock (e.g., this may be the case of a low-noise mode), the clock can be supplied through a dedicated pin.

This may result in a limitation of the possible field of application of the device insofar as a dynamic transition from one mode to another (as possibly desired) is not supported.

Solutions providing greater flexibility in these cases, with a single pin of a device configured to facilitate dynamic (e.g., on-the-fly) transition between different modes of operations and managing an external synchronization clock through a same pin would be desirable.

SUMMARY

According to one or more embodiments, a circuit and method are provided herein.

As discussed, the flexibility of those devices having different modes of operation suited to being selected from the outside may be penalized in applications where changing the mode of operation on-the-fly is desirable. As noted, static selection between two different modes of operations via pin-strapping or by assigning different part numbers to each of the two modes does not address that issue adequately.

At least in principle, a dynamic mode change could be implemented by the programming of internal registers, which would involve the continuous accessibility of a standard programming interface.

One or more embodiments can exploit a single pin of a device with a reduced area increase to facilitate possible dynamic management of two different modes of operation while also providing an external synchronization clock through the same pin.

In one or more embodiments, using a single pin offers the advantage of avoiding using plural pins in the case of a device that is configured to switch dynamically between two different modes of operation, with one of the two modes involving an external clock for synchronization. In such an embodiment, the additional pin(s) would be unused in the case of a mode of operation which does not involve an external clock.

In one or more embodiments, a mode of operation can be determined through a time evaluation of the level present on, for example, an input pin (e.g., single). Such a configuration may be used for mode selection and for applying an external clock.

In one or more embodiments, an externally-controlled level is associated with each mode, with logic circuit configured to check the change of the level of the signal by detecting, for example, falling edges associated to level changes. In these embodiments, a low level is associated with a first mode of operation (MODE1), and a high level is associated with a second mode of operation (MODE2). For example, if the level signal is driven low at startup, the device is "aware" that the current configuration is in MODE1 and the related configuration is implemented in the device. If a level change occurs, which may involve a change of configuration, the logic circuit can process the related information evaluating a time duration. A (lower) time threshold value can be selected for each specific application. The change of configuration is validated if the signal on the (single) pin discussed previously is maintained constant at a level for a time duration over the threshold value.

The presence of a clock signal on the pin can be detected as a continuous level change.

One or more embodiments may include a finite state machine (FSM) circuit that handles the change between the two modes of operation and the external clock, along with an enable and control signal. An edge detector may be provided to detect rising or falling edges of a signal at the input pin corresponding to a level change. A level filter may be provided to evaluate the level change signal to, for example, check whether this is maintained for a time longer than a time threshold before modifying the mode or state of operation.

BRIEF DESCRIPTION OF THE DRAWINGS

For a more complete understanding of the present disclosure and the advantages thereof, reference is now made to the following descriptions taken in conjunction with the accompanying drawings, in which.

DETAILED DESCRIPTION OF ILLUSTRATIVE EMBODIMENTS

This disclosure provides many applicable inventive concepts that can be embodied in a wide variety of specific contexts. The particular embodiments are merely illustrative of specific configurations and do not limit the scope of the claimed embodiments. Features from different embodiments may be combined to form further embodiments unless noted otherwise.

Variations or modifications described to one of the embodiments may also apply to other embodiments. Further, it should be understood that various changes, substitutions, and alterations can be made herein without departing from the spirit and scope of this disclosure as defined by the appended claims.

In the ensuing description, one or more specific details are illustrated, aimed at providing an in-depth understanding of examples of embodiments of this description. The embodiments may be obtained without one or more of the specific details or with other methods, components, materials, etc. In other cases, known structures, materials, or operations are not illustrated or described in detail so that certain aspects of embodiments will not be obscured.

Reference to "an embodiment" or "one embodiment" in the framework of the present description is intended to indicate that a particular configuration, structure, or characteristic described in relation to the embodiment is comprised in at least one embodiment. Hence, phrases such as "in an embodiment" or "in one embodiment" that may be present in one or more points of the present description do not necessarily refer to one and the same embodiment.

Moreover, particular conformations, structures, or characteristics may be combined in any adequate way in one or more embodiments.

The headings/references used herein are provided merely for convenience and hence do not define the extent of protection or the scope of the embodiments.

One or more embodiments can be applied, for instance, to a circuit such as the L7983 Synchronous step-down Switching Regulator device as currently available with companies of the STMicroelectronics group.

Such a circuit can be taken as exemplary of a circuit capable of (at least) two different modes of operations, namely Low Consumption Mode (LCM) and Low Noise Mode (LNM); taking advantage of, for example, the possibility of managing these two modes through a single pin and of synchronizing with an external clock the switching activity for the Low Noise Mode. Reference to such a circuit is merely by way of example and is not limiting of the embodiments.

One or more embodiments facilitate the selection between different modes of operation (e.g., with dynamic management of the transitions from one to the other) through a single pin of the device. Also, one or more embodiments provide logic circuit capable of checking whether an external synchronization clock signal is present on that pin.

As discussed, certain devices for which the mode of operation is fixed at startup (e.g., through a pull-up to VCC or a pull-down to GND on a selection pin) do not contemplate the possibility of changing the mode of operation dynamically as desirable for various applications.

For example, in certain devices, the configuration is fixed via a trimming bit, which can limit flexibility. Furthermore, if synchronization with an external clock is contemplated for one of the modes of operations, the pin used to provide the clock can be left floating when the device is configured for the mode or an application where synchronization is not desired.

One or more embodiments may involve a temporal evaluation mechanism of the signal value at an input pin used for device configuration, thus providing greater flexibility in the use of the device.

Figure 1:
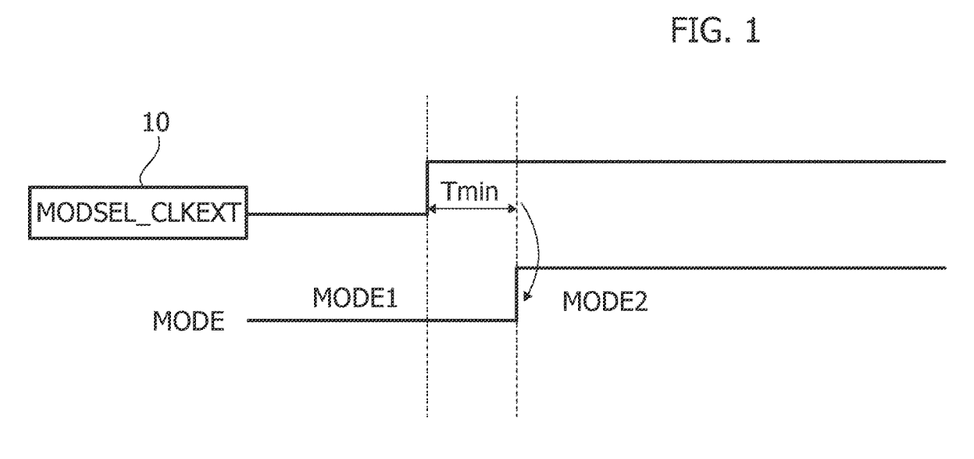
FIGS. 1 and 2 are diagrams of embodiment modes of operation transitions.
Figure 2:
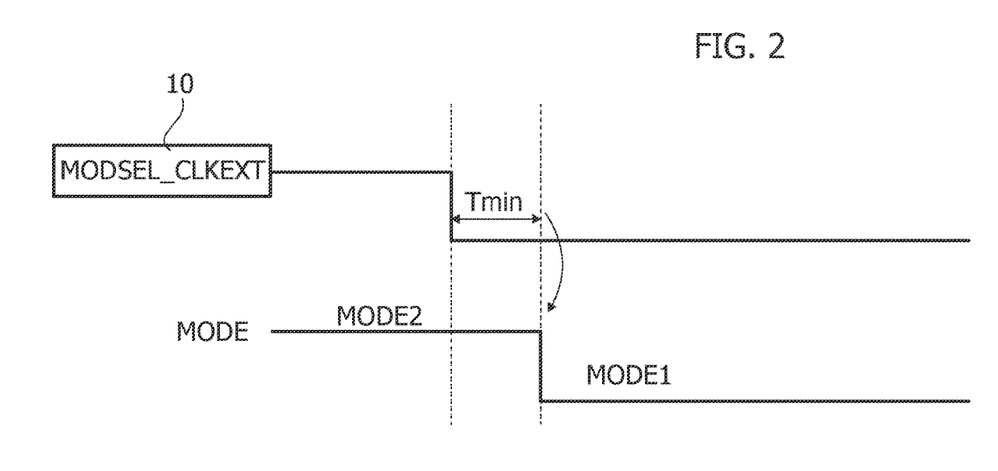

FIGS. 1 and 2 refer by way of example to possible transitions between two modes of operations, namely MODE1 and MODE2. FIG. 1 is exemplary of the transition from MODE1 to MODE2. FIG. 2 is exemplary of the transition from MODE2 to MODE1. It will be otherwise appreciated that one or more embodiments are largely "transparent" to the nature of these modes of operation.

The example shown refers to a pin 10 in an electronic circuit (not visible as a whole in FIGS. 1 and 2). Pin 10 may be configured to receive a signal MODSEL_CLKEXT used for selecting between the two modes of operations (i.e., MODE1 and MODE2).

Throughout this description, for the sake of simplicity and ease of understanding, pin 10 will also be referred to as the MODSEL_CLKEXT pin.

In the example shown, such a MODSEL_CLKEXT pin can also be used to provide the associated device with an (e.g., external) synchronization clock CLKEXT, as desirable for either (or both) of the two aforementioned modes of operation.

For example, a mode of operation, MODE1 or MODE2, may be selected on the MODSEL_CLKEXT pin, by keeping the pin at a constant level (e.g., high or low, with each level associated with one of the modes) for a time Tmin. The time Tmin for maintaining the signal level can be set as a function of (possibly by) the application for which the device is intended to be used.

For example, in FIG. 1, when MODE1 is active, a rising edge of the signal at the MODSEL_CLKTEXT pin can be "filtered" over Tmin to detect a stable high level before an internal mode signal is set to MODE2.

Further, in FIG. 2, when MODE2 is active, a falling edge of the signal at the MODSEL_CLKTEXT pin can be "filtered" over Tmin to detect a stable low level before an internal mode signal is set to MODE1.

Those of skill in the art will readily appreciate that specific reference to rising/falling edges and high/low levels is merely exemplary insofar as a same type of operation can be obtained with the roles of the rising/falling edges and/or the high/low levels reversed.

In one or more embodiments, the time Tmin can be used to determine the current mode of operation (i.e., MODE1 or MODE2), and facilitate a dynamic transition between the two modes when a change in the mode of operation is desired.

One or more embodiments may involve a detection logic that continuously detects the rising and falling edges of the signal at the MODSEL_CLKEXT input pin with the capability of detecting level variations and determining the mode of operation based on the following mechanism.

For example, if at device startup the high or low level of the signal at MODSEL_CLKEXT remains stable for a minimum time T at least equal to Tmin, the device is configured in the corresponding mode of operation.

Further, if a (falling or rising) edge of the signal is subsequently detected, causing the level to change (passing from high to low, or vice versa, for instance)—and—the new level is maintained for a time T at least equal to Tmin, then the logic interprets this level change as intended to produce a change of the mode of operation of the device.

Moreover, if a train of pulses (e.g., a continuous level variation or toggling) is detected at the pin, a check is made as to the possible presence of an external synchronization clock—spikes affecting the signal value or consecutive transitions between the mode of operations.

For example, if the signal level at the MODSEL_CLKEXT pin is detected to switch at time intervals T shorter than the time Tmin taken as an indication of a stable level, the time between successive rising edges of the signal can be analyzed (e.g., based on information received from circuit blocks capable of filtering an external clock).

Further, if at least N rising edges of the signal are detected, spaced by a time that is less than or equal to a lower threshold Tckmin, the presence at the pin of a CLKEXT clock signal with a frequency greater than or equal to 1/Tckmin is assumed.

The time Tckmin can be selected as an indication of the longest (i.e., maximum value of the) period contemplated for an external clock—the lowest (i.e., minimum) frequency in the range of frequencies contemplated for the external clock. A summary of the selection mechanism discussed above is reproduced in the following Table I.

TABLE I mode of operation selection based on the signal level

| signal MODSEL_CLKEXT (i.e., pin 10) | mode of operation |
|---|---|
| Stable LOW for T ≥ Tmin | MODE1 selected |
| Stable HIGH for T ≥ Tmin | MODE2 selected |
| Toggle with T < Tmin | MODE2 or MODE1 selected with external clock on MODSEL_CLKEXT (i.e., pin 10) |

Those of skill in the art will again appreciate that specific reference to low/high levels and MODE1/MODE2 is merely exemplary insofar as the roles of the levels and the modes can be reversed in implementing a same type of operation.

In an embodiment, a circuit such as an integrated device is considered having (at least) two different modes of operations (e.g., MODE1 and MODE2), which can be selected as a function of two different levels of a signal applied to an input pin (MODSEL_CLKEXT), wherein the same pin can also provide an external clock for synchronization.

In this embodiment, driving the pin from the outside via, for example, a microprocessor or other logic circuit facilitates a change on-the-fly of the mode of operation of the device switching, for example, to MODE2 while MODE1 is active (see FIG. 1), or to in MODE1 when MODE2 is active (see FIG. 2).

For example, in the example illustrated, the mode of operation can be regarded as a default mode active at device startup, which can be selected in response to a low-level signal ("0") at the MODSEL_CLKEXT input pin.

The control logic processes the corresponding signal of value "0" and indicates the value MODE1 for an internal MODE signal.

The mode MODE2 can be selected in response to a high level present at the input pin MODSEL_CLKEXT to which the value "1" of the internal MODE signal corresponds.

Figure 3:
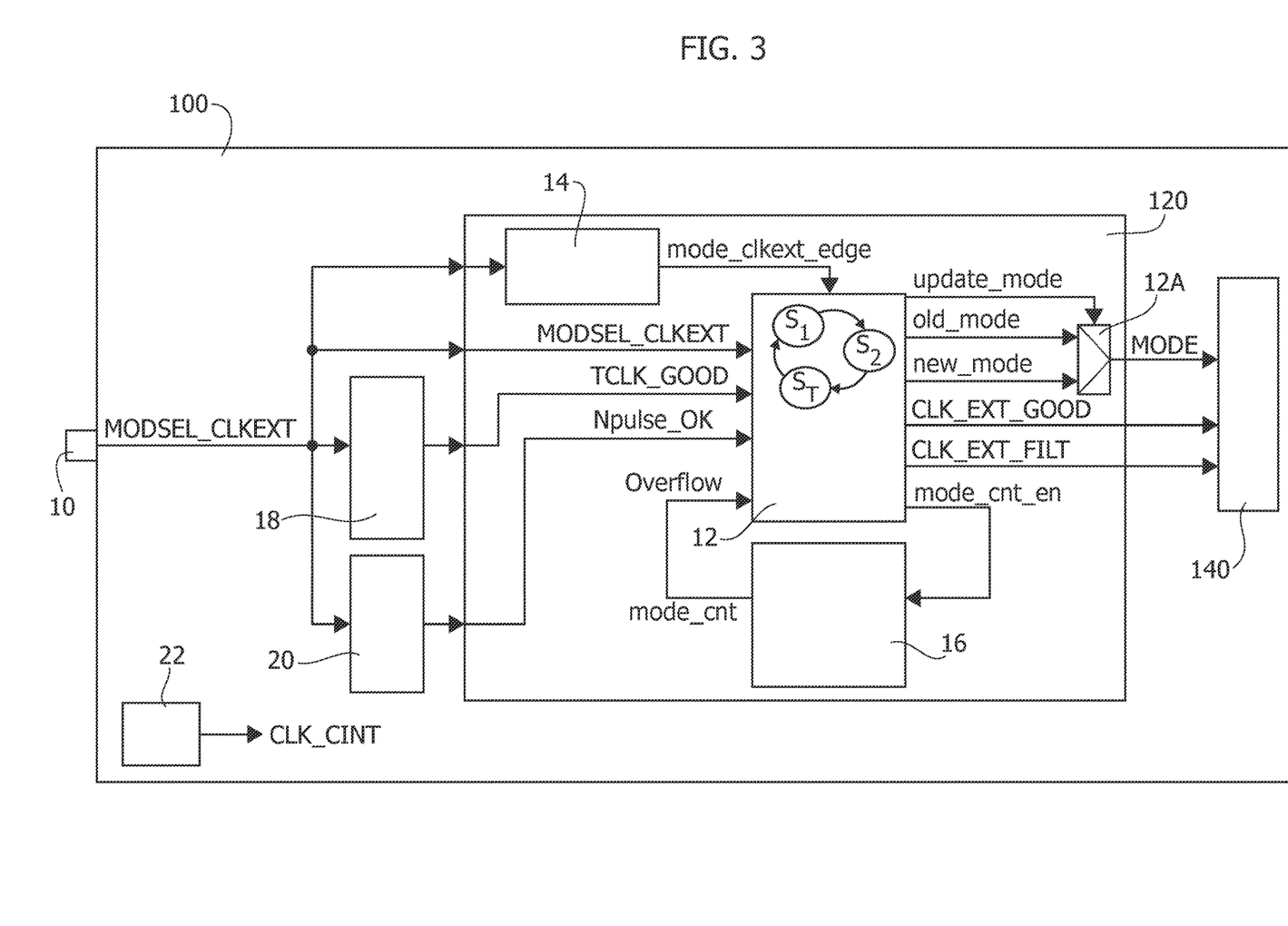
FIG. 3 is a block diagram of an embodiment.

FIG. 3 is a block diagram exemplary of an embodiment circuit 100 as per embodiments of the present description comprising control logic and some supporting blocks.

As illustrated in FIG. 3, circuit 100 includes a logic circuit 120 built around a finite state machine (FSM) circuit 12 configured to manage the transition between the two modes of operations (i.e., MODE1, MODE2) as well as the selection of an external clock as a function of signals from various blocks in the logic circuit and support circle blocks.

For example, as illustrated in FIG. 3, a circuit 12A can be configured to produce a MODE signal (MODE=MODE1 or MODE2) as a function of signals old_mode, new_mode, and update_mode for the finite state machine circuit 12 as discussed in the following.

As similarly discussed in the following, the finite state machine circuit 12 can also be configured to produce signals CLK_EXT_GOOD and CLK_EXT_FILT related to the selection of an external clock as discussed in the following.

As illustrated in FIG. 3, the logic circuit 120 includes an edge detector circuit 14 that is sensitive to the signal MODSEL_CLKEXT at the pin 10. The edge detector circuit 14 is configured to detect rising or falling edges of the input signal received at that pin which corresponds to variations in the level of the signal MODSEL_CLKEXT and produces a respective signal mode_clkext_edge applied to the finite state machine circuit 12.

As illustrated in FIG. 3, the logic circuit 120 also includes a timer circuit 16. The timer circuit 16 can include a counter configured to evaluate (i.e., enabled by a signal mode_cnt_en from the finite state machine circuit 12) whether the change in the level of the signal MODSEL_CLKEXT at pin 10 is maintained for a minimum time (Tmin) before validating a new mode of operation. This may involve producing an Overflow signal applied to the finite state machine circuit 12 as a result of a count signal mode_cnt (see also FIGS. 4 and 5) reaching an upper threshold value (Thmin) which is a function of the time Tmin discussed previously.

As illustrated in FIG. 3, the logic circuit 120 also receives information from check circuit 18 and counter circuit 20 to validate the presence of an external dock signal possibly applied as MODSEL_CLKEXT signal to pin 10.

As illustrated in FIG. 3, check circuit 18 includes a counter configured to evaluate whether the frequency of an incoming pulse train received at pin 10 corresponds to (i.e., is consistent with) a lowest (i.e., minimum) frequency allowed for an external clock, by producing a respective signal (i.e., designated TCLK_GOOD in the figure) applied to the finite state machine circuit 12.

As illustrated in FIG. 3, counter circuit 20 includes another counter configured to count a number N of rising edges of an incoming pulse train received as MODSEL_CLKEXT, which facilitate determining the presence of the external clock by producing a respective signal (i.e., designated NPulse_OK in the figure) applied to the finite state machine circuit 12.

As illustrated in FIG. 3, circuit 100 also includes a clock circuit 22 (of any type known to those of skilled in the art) which produces an internal clock signal CLK_INT supplied to the control logic 120 as discussed in the following in connection with FIGS. 5 and 6.

Even if illustrated as a separate element for ease of explanation, the clock circuit 22 can be included in circuit 140 in FIG. 3.

As illustrated in FIG. 3, the logic circuit 120 is configured to pass the signals MODE, CLK_EXT_GOOD and CLK_EXT to another circuit 140 in circuit 100. These circuit stages may include, for instance, one or more analog blocks and an oscillator.

One or more embodiments are largely "transparent" to the nature of the circuit 140, which further motivates the embodiments in being largely transparent to the very nature of the modes (i.e., MODE1, MODE2).

Figure 4:
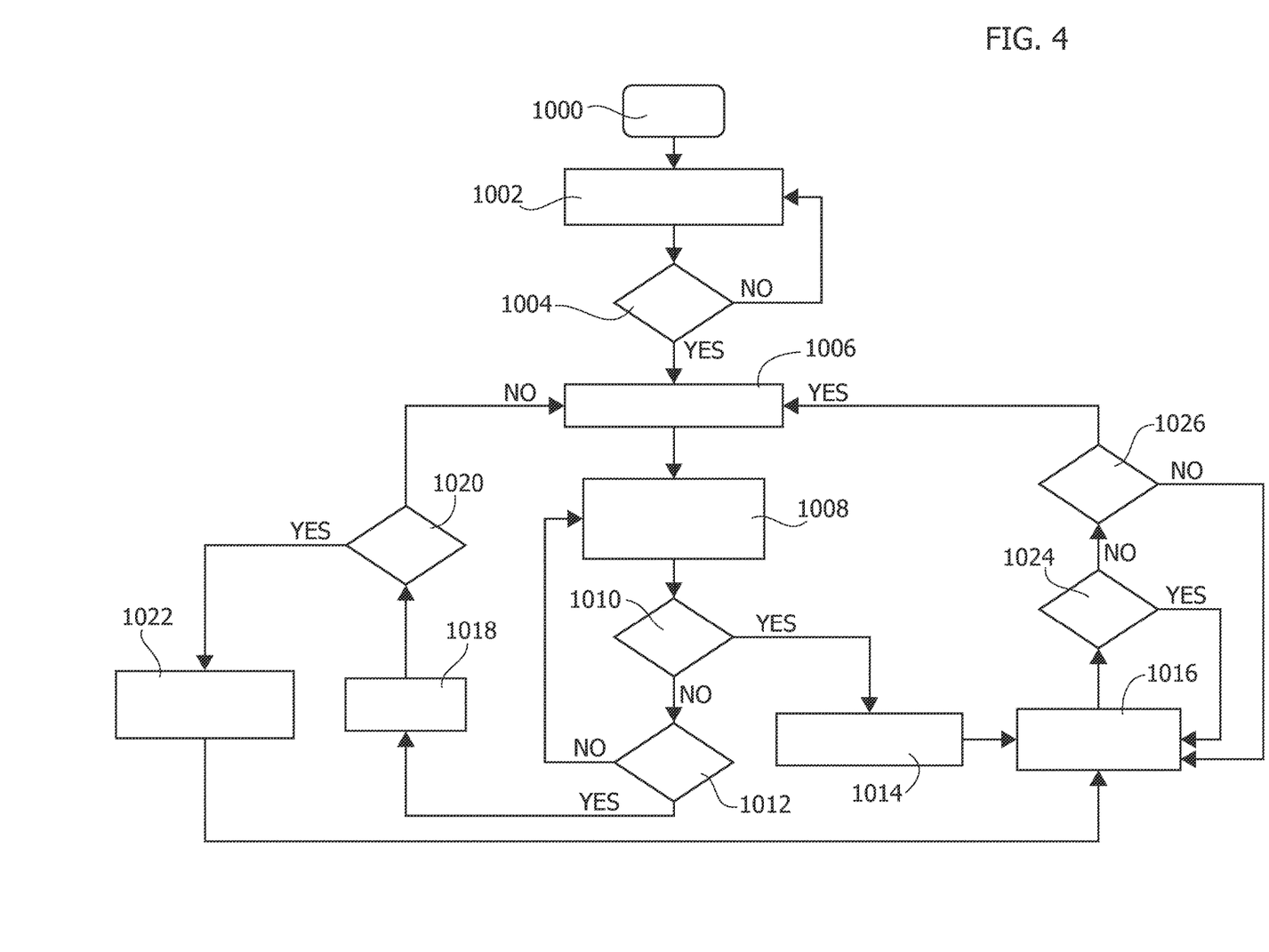
FIG. 4 is a flowchart of an embodiment operation.

FIG. 4 is a flowchart of exemplary embodiment of the possible operation of a control logic circuit as discussed previously.

Step 1000 corresponds to a START (startup mode).

At step 1002, the device is configured for operating in a default mode selected out of MODE1 and MODE2 as a function of the current value (e.g., low or high) of the signal MODSEL_CLKEXT (i.e., MODE=MODSEL_CLKEXT).

At step 1004, check as to the occurrence of a rising/falling edge in the signal MODSEL_CLKEXT as indicated by the signal modsel_clkext_edge from the edge detector circuit 14. If the check yields a negative outcome (NO=no edge detected), return to step 1002.

At step 1006, if check at step 1004 yields a positive outcome (i.e., YES=edge detected), the signal mode_new is made equal to MODSEL_CLKEXT.

At step 1008, the duration of the level transition resulting from the edge is measured by setting mode_cnt_en="1", increasing a count CNT=CNT+1, and setting mode to current mode, namely MODE=mode_curr.

At step 1010, the current (accumulated) count value is checked for overflow against a threshold corresponding to Tmin. At each increment, the value is compared with the threshold, and an overflow signal is generated in response to the count reaching the count value At step 1012, if the check at step 1010 yields a negative outcome (i.e., NO=threshold duration not exceeded), a further check is performed as to whether modsel_clkext_edge from the edge detector circuit 14 indicates a (further) edge. If the check at step 1012 yields a negative outcome (i.e., NO=no further edge detected), return to step 1008.

At step 1014, if check outcome at step 1010 is positive (i.e., YES=count overflow occurred, indicative of a level change in MODSEL_CLKEXT lasting more than Tmin), mode_cnt_en="0" and update_mode=mode_new.

At step 1016, mode of operation is set to the new mode (resulting from change) MODE=update_mode.

At step 1018, in response to the outcome of the check at step 1012 being positive (i.e., YES=further edge detected) CNT is set to "0" as expectedly indicative of a spike in the input signal when the counter has not exceeded the threshold.

At step 1020, check as to whether CLK_EXT_GOOD from check circuit 18 indicates a frequency of an incoming pulse train received consistent with the lowest (e.g., minimum) frequency allowed for the external clock. If the check outcome at step 1020 is negative (i.e., a spike in the input signal confirmed), return to step 1006.

At step 1022, in response to check outcome at step 1020 being positive (i.e., the frequency of the incoming pulse train received is consistent with the minimum frequency allowed for the external clock), go to step 1016 as discussed previously At step 1024, irrespective of the path followed to reach step 1016 (e.g., from step 1014 or step 1022), a further check is performed as to whether CLK_EXT_GOOD from the check circuit 18 indicates a frequency of an incoming pulse train received consistent with the minimum frequency allowed for the external clock. If the check outcome at step 1024 is positive, return to step 1016.

At step 1026, in response to check outcome at step 1024 being negative (i.e., NO), a further check is performed as to whether modsel_clkext_edge from the edge detector circuit 14 indicates a (further) edge. If the check outcome at step 1026 is negative (i.e., NO=no further edge detected), return to step 1016. If the check outcome at step 1026 is positive (i.e., YES=further edge detected), return to step 1006.

It is noted that step 1016 is reached from step 1014 in response to a count overflow corresponding to a change of mode—the check on CLK_EXT_GOOD at step 1024 will be negative and the current mode will be maintained until there a new signal edge occurs.

Moreover, step 1016 is reached from step 1022 in response to an external clock being recognized—the check on CLK_EXT_GOOD at step 1024 will be positive, and the mode corresponding to the presence of the external clock will be maintained until the check becomes negative.

Furthermore, the signal CLK_EXT_GOOD, generated by finite state machine circuit 12, is dependent on the signals TCLK_GOOD (e.g., distance between two successive rising edges corresponding to a minimum expected frequency) and Npulse_OK (e.g., count of at least N>1 rising edges on the MODSEL_CLKEXT pin) coming from check circuit 18 and counter circuit 20, respectively, with these blocks being both active on the rising edges of the signal at the MODSEL_CLKEXT pin.

Figure 5:
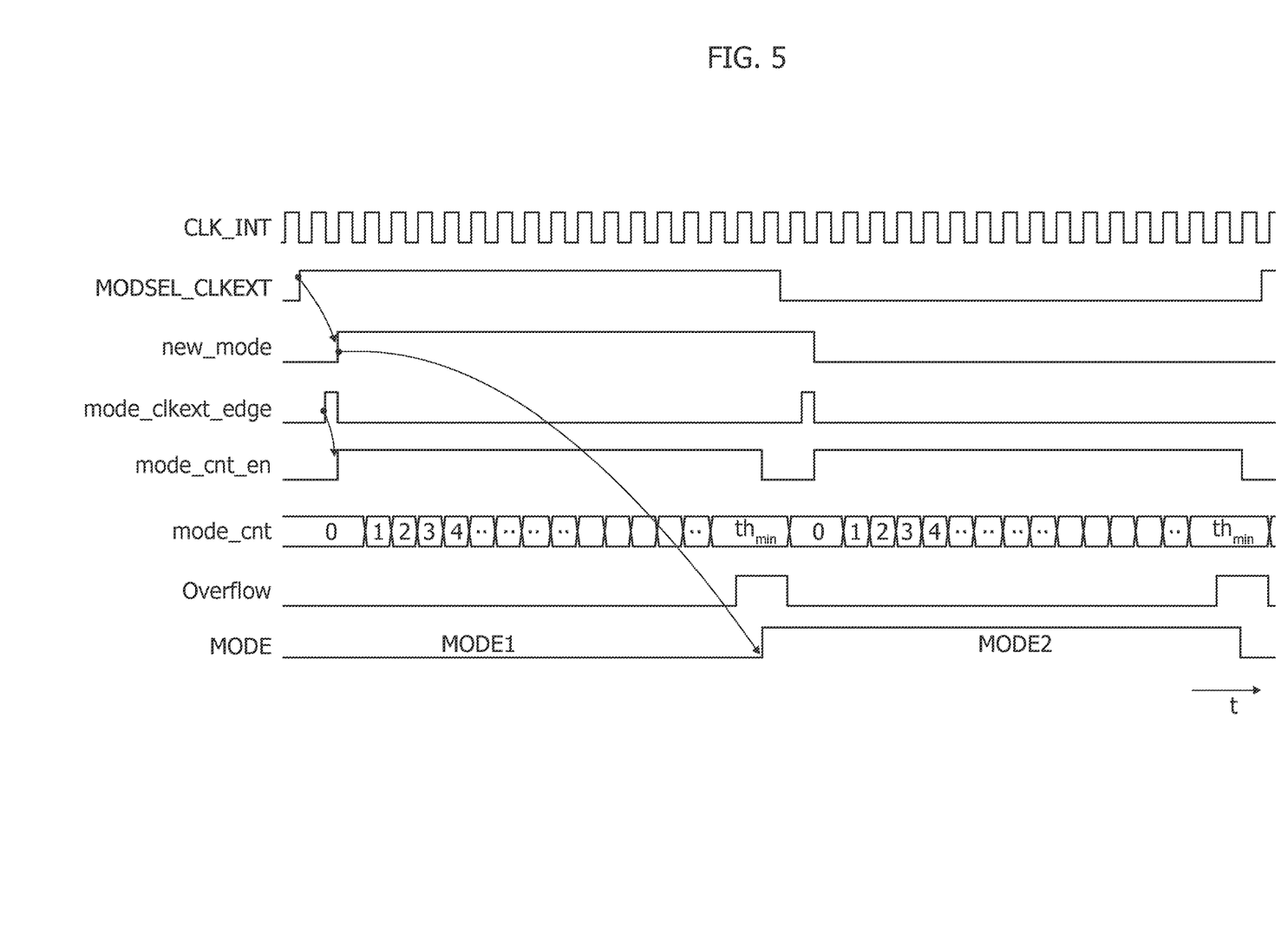
FIG. 5 is a diagram of an embodiment modes of operation transitions held to be valid.
Figure 6:
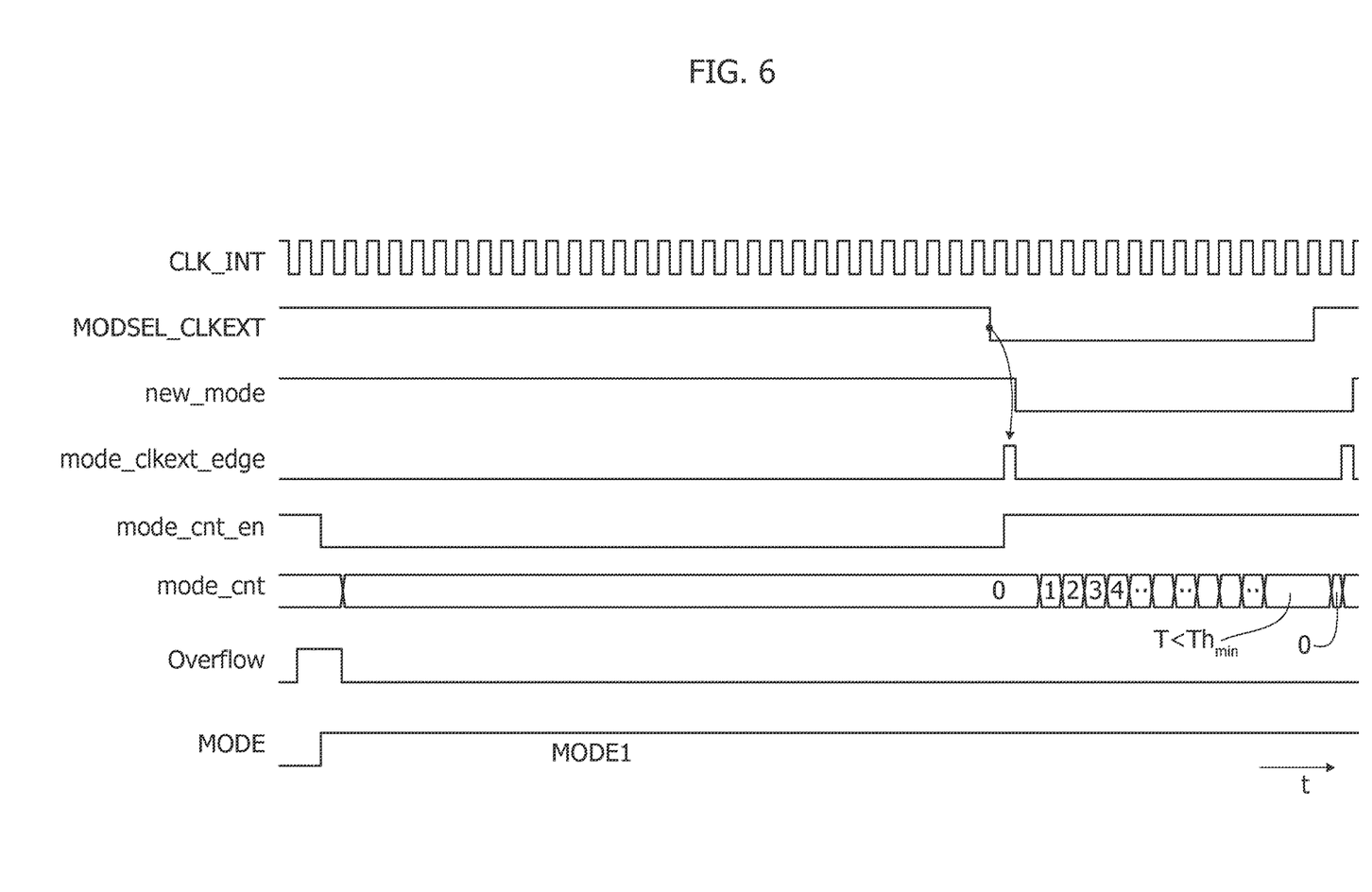
FIG. 6 is a diagram of an embodiment modes of operation transitions held not to be valid.

Operation, as discussed previously, can be further exemplified by referring to FIGS. 5 and 6. These figures portray, against a common time scale t (abscissa scale), a possible time behavior of the following signals (from top to bottom): the internal clock signal CLK_INT from the clock circuit 22 (FIG. 3); the signal MODSEL_CLKEXT received at pin 10; the signal new_mode from the finite state machine circuit 12; the signal mode_clkext_edge from the edge detector circuit 14; the enable signal mode_cnt_en provided by the finite state machine circuit 12 to the timer circuit 16; the level filter signal mode_cnt; the Overflow signal provided by the timer circuit 16 to the finite state machine circuit 12 in response to the signal mode_cnt reaching an upper threshold value $th_{min}$. (which is a function of the threshold time Tmin); and the MODE signal which switches (from MODE1 to MODE2, for instance).

Briefly, when the signal on the MODSEL_CLKEXT pin (i.e., pin 10) experiences a level transition (e.g., from low to high in FIG. 5), the edge detector circuit 14 detects the change (that is the signal edge) and generates a corresponding mode_clkext_edge pulse.

This pulse is processed in the finite state machine circuit 12, which consequently performs various actions as discussed previously in connection with the flowchart of FIG. 4: the mode_cnt_en signal is generated, enabling the timer circuit 16, the MODE signal is maintained at the current level (e.g., low level=MODE1) until a new level is validated (e.g., high level=MODE2), and the variation to the new level is stored via the internal signal new_mode (e.g., high level=MODE2).

The timer circuit 16, enabled by the mode_cnt_en signal from the finite state machine circuit 12, increases the mode_cnt counter at each cycle of the internal clock CLK_INT until the threshold count value $th_{min}$ is reached.

As discussed, this threshold value can be defined as a function of the minimum time value Tmin established for the validation of the mode of operation of the device.

When the mode_cnt counter reaches the threshold (e.g., without a further change in the signal level having been detected), the timer circuit 16 generates the Overflow signal (e.g., flag) that resets the count.

In response to detecting the Overflow flag, the finite state machine circuit 12 updates the internal MODE signal to the logical value previously stored on "new_mode" (e.g., high level=MODE2), which was evaluated to be stable over the time Tmin by the timer circuit 16.

The device mode of operation is then updated to the new mode of operation (e.g., MODE2).

Similarly, if a subsequent falling edge is detected on the input pin (i.e., MODSEL_CLKEXT at pin 10) and after this edge the signal level remains low for a time greater than Tmin, the finite state machine circuit 12 will change the mode of operation again (e.g., to MODE1).

If the signal present on the input pin changes level again and then returns to the previous level before the counter (signal mode_cnt) reaches the threshold $th_{min}$, then the logic circuit 120 will not change the value of the MODE signal, considering the variation as a spike of the input signal.

This possible mode of operation is exemplified in FIG. 6.

As noted, FIG. 5 is exemplary of a mode transition leading to a change from MODE1 to MODE2 in response to a rising edge in the signal MODSEL_CLKEXT, which results in the Overflow signal being asserted.

By way of contrast, the right-hand side of FIG. 6 is exemplary of an "invalid" mode transition where MODE1 is maintained (irrespective of a falling edge in the signal MODSEL_CLKEXT) as a consequence of the count signal mode_cnt failing to reach the threshold value corresponding to $Th_{min}$.

If a train of pulses occurs on the MODSEL_CLKEXT pin (i.e., pin 10), the logic circuit 120 may investigate whether this corresponds to an external clock or results from continued variations in the mode of operation.

Figure 7:
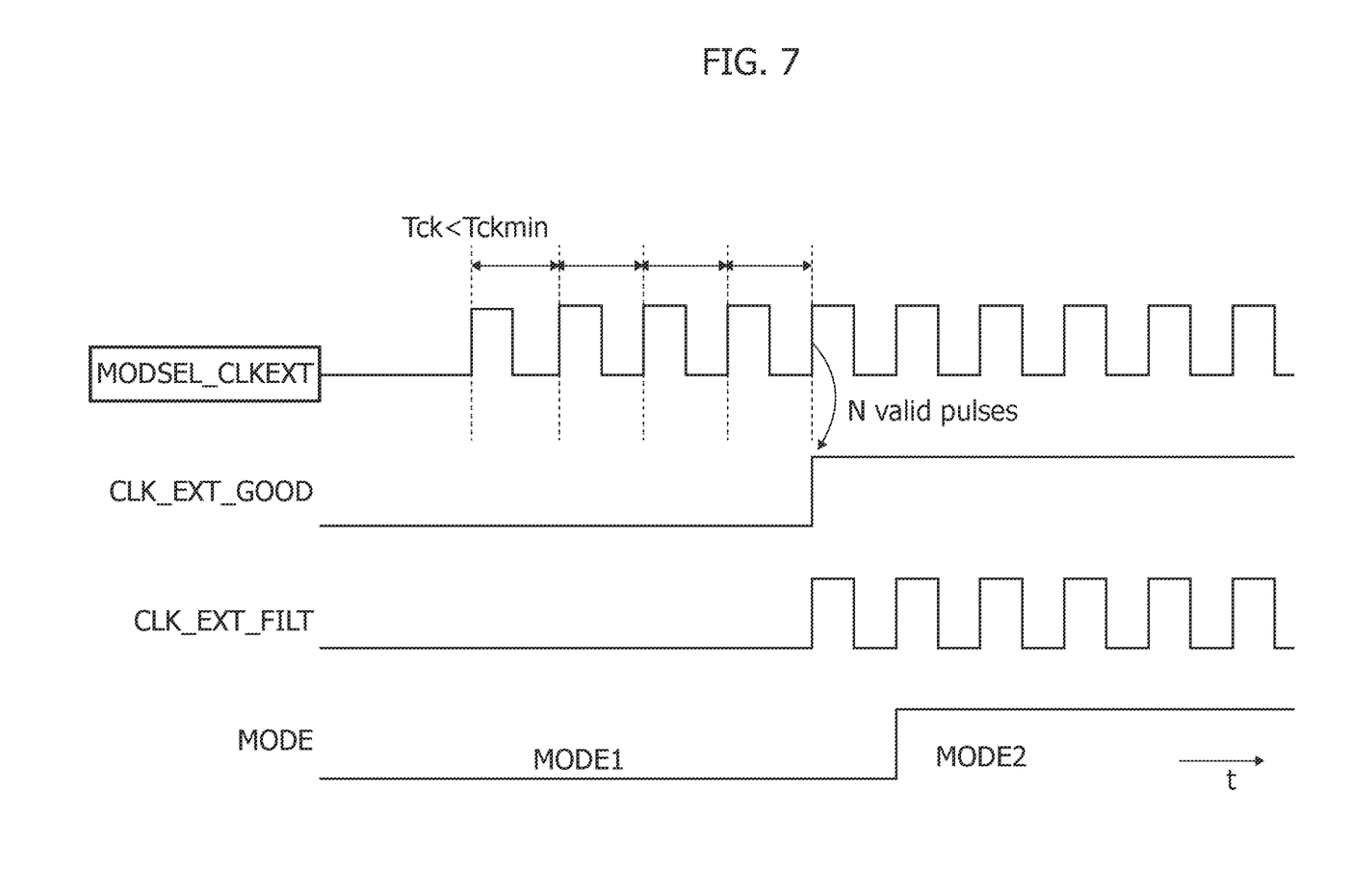
FIG. 7 is a diagram of an embodiment external clock validation.
Figure 8:
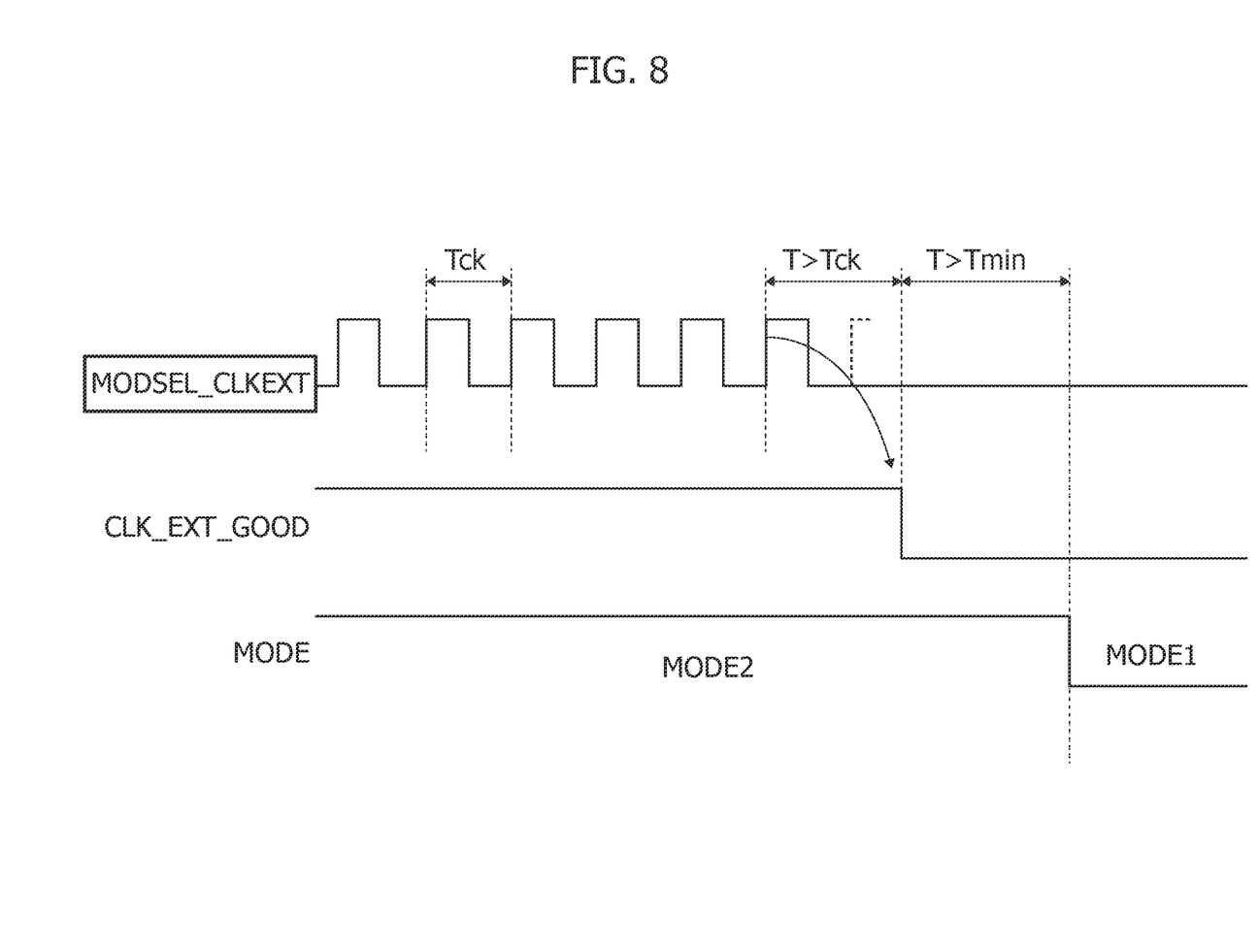
FIG. 8 is a diagram of an embodiment external clock removal.

This type of operation is exemplified in FIG. 7 (external clock validation) and FIG. 8 (external clock removal).

These figures portray, once more against a common time scale t (abscissa scale), a possible time behavior of the following signals (from top to bottom): the signal MODSEL_CLKEXT received at pin 10; the signal CLK_EXT_GOOD from the finite state machine circuit 12; the signal CLK_EXT_FILT from the finite state machine circuit 12; and the MODE signal which switches (e.g., from MODE1 to MODE2 in FIG. 7 and from MODE2 to MODE1 in FIG. 8).

As exemplified herein, counter circuit 20 detects each rising edge of the signal on the MODSEL_CLKEXT pin (i.e., pin 10) and generates the Npulse_OK signal in response to a number N of rising edges having been counted.

At the same time, filtering of the frequency of a clock signal received at the MODSEL_CLKEXT pin (i.e., pin 10) is performed in check circuit 18. The check circuit 18 is active at each rising edge of the signal on the MODSEL_CLKEXT pin and is configured to evaluate the distance between two successive rising edges and to undergo reset when the distance between the edges exceeds the value for a minimum expected frequency for a (desired) outer clock signal.

If the edges detected are separated by a time Tck shorter than Tckmin, check circuit 18 generates the TCLK_GOOD signal. Consequently, the logic circuit 120 will generate the internal signal CLK_EXT_GOOD to validate the presence of the external clock CLK_EXT on pin 10 (MODSEL_CLKEXT). The clock will therefore have a period defined by the switching time Tck of the pulse train.

The MODE signal will be adapted to the mode MODE2, which in the example shown provides for the provision of/synchronization with an external clock.

For example, if MODE1 was active before the train of pulses is received, then MODE is changed from MODE1 to MODE2. On the other hand, if MODE2 was the active mode before the pulse train, MODE 2 will be confirmed. In both cases, the logic circuit 120 will pass the external clock to the circuit 140 (see FIG. 3) through the CLK_EXT_FILT output of the finite state machine circuit 12.

That is, as exemplified in FIG. 7: the logic circuit 120 filters the value on the pin MODSEL_CLKEXT (pin 10) to check for a valid external clock and the clock is validated if at least N rising edges are detected separated by a distance Tck lower then Tckmin (CLK_EXT_GOOD asserted). Once validated, the clock is forwarded internally of the finite state machine circuit 12 to the circuit 140 (CLK_EXT_FILT asserted) and the internal signal MODE is set to MODE2 or confirmed at MODE2.

If, conversely (see FIG. 8), during the time Tck no rising edge is detected, the validation signal CLK_EXT_GOOD is reset, and the logic circuit 120 enables the counter in the timer circuit 16 to check if the signal level on the MODSEL_CLKEXT pin remains stable for a time T>Tmin.

If the signal on the MODSEL_CLKEXT pin remains stable (e.g., high) up to the threshold set by Tmin, then the internal MODE signal is kept at MODE2. If, on the other hand, it is steadily low for Tmin then the internal signal will switch to MODE1.

The logic circuit 120 thus continuously monitors the variations of the signal on the input pin (MODSEL_CLKEXT—pin 10), facilitating a dynamic transition between the mode of operations (MODE1 to MODE2 and vice-versa) provided by the device and the management of a possible external clock.

That is, as exemplified in FIG. 8: the logic circuit 120 continuously checks if the distance between two consecutive rising edges is shorter (lower) than Tck and if the distance is longer (higher) than Tck, the signal CLK_EXT_GOOD is reset. The logic circuit 120 starts counting T>Tmin to detect if a stable level (high or low) is present on input pin and change correspondingly the internal MODE signal.

The examples illustrated herein refer to cases where an external synchronization clock is contemplated for one of the two modes only (here, the mode indicated as MODE2).

Those of skill in the art will otherwise appreciate that the instant disclosure applies mutatis mutandis also to the more general case where an external synchronization clock is admitted by both the MODE1 and MODE2 modes.

In this case, a user may set a first desired mode with a first action, keeping the signal level stable for a time T>Tmin, and then provide the synchronization clock as described.

As repeatedly noted in the foregoing, those of skill in the art will easily appreciate that specific reference to certain signal edges being rising and falling edges, respectively, and certain signal levels being high and low levels, respectively, is merely exemplary insofar as the same type of operation can be obtained, for instance, with the roles of the rising/falling edges and/or the high/low levels reversed.

A circuit (for instance, 100) as exemplified herein may include logic circuit (for instance, 120) coupled to an input node (for instance, 10) configured to receive an input signal (for instance, MODSEL_CLKEXT) exhibiting transitions between a first level and a second level. The logic circuit may include a state machine (for instance, 12) coupled to the input node. The state machine is configured to set (e.g., via the signal MODE) the circuit (e.g., 100—including the stages 140) to either one of a first mode of operation (e.g., MODE1) and a second mode of operation (e.g., MODE2) in response to the input signal having the first level or second level, respectively.

Further, an edge detector block (e.g., 14) is coupled to the input node. The edge detector block is configured to detect transitions (e.g., rising and falling edges) between the first level and second level in the input signal and to send a corresponding transition signal (e.g., mode_clkext_edge) to the state machine (12), Moreover, a timer block (e.g., 16) is coupled (e.g., to be enabled via the signal mode_cnt_en) to the state machine and configured to check if the first level or second level in the input signal is maintained over a threshold interval (e.g., Tmin) starting from a transition detected by the edge detector block.

The state machine is configured to change the mode of operation of the circuit from one to the other of the first mode of operation and the second mode of operation in response to the check in the timer block indicating that the first level or second level in the input signal has been maintained over the threshold interval starting from a transition detected by the edge detector block.

A circuit as exemplified herein may include a processing circuit (e.g., check circuit 18 and counter circuit 20) coupled to the input node and the state machine. The processing circuit is configured to apply the signal received at the input node as a validated clock signal to the circuit in response to the input signal exhibiting a number N of transitions from one to the other of the first level and the second level and a frequency of transitions between the first level and the second level in excess of a lower threshold value.

One or more embodiments may thus take advantage of an edge occurring within Tmin and on a lower (e.g., minimum) limit posed to the frequency of the edges in order to be able to assert that a real clock is applied to the pin.

If the pin level changes with a frequency lower than a threshold value for the frequency of the external signal to be recognized as a clock signal (which threshold frequency may be selected and set as a function of the intended application or context of use), considering the signal as a clock would be erroneous, insofar as the signal would merely correspond to the user being in the process of selecting one mode in the place of the other.

In one or more embodiments, to evaluate the presence of an external clock, the time TCKmin that elapses between two successive rising edges of the signal is checked to be less than the time Tmin over which the signal is maintained stable after a level change to result in a mode change.

Also, even in the presence of an "acceptable" frequency value, checking the presence of a number N of transitions from one to the other of the first level and the second level may provide a safety limit in asserting the presence of a clock signal via a masking action on a (e.g., minimum) desired number of clock periods N (with N=1 representing the limit case for such a masking action).

A circuit as exemplified herein may be configured to apply the signal received at said input node as a validated clock signal to the circuit for only one of the first mode of operation and the second mode of operation (e.g., only for MODE2 and not for MODE1).

That is, the clock signal may (but not necessarily must) be passed on to the circuit for only one of the two modes, which in turn means that a clock signal being recognized at MODSEL_CLKEXT does not imply a change between MODE1 and MODE2.

In a circuit, as exemplified, the state machine may thus be configured to apply the signal received at the input node as a validated clock signal to the circuit in combination with setting the circuit to, or maintaining the circuit at, said only one of the first mode of operation and the second mode of operation.

To that effect, the state machine may be configured to change the mode of operation of the circuit only if one of the two levels at MODSEL_CLKEXT is maintained over the threshold interval Tmin starting from a transition detected by the edge detector circuit 14.

For example, if the signal at MODSEL_CLKEXT remains high up to the threshold represented by Tmin, then the internal MODE signal is maintained at MODE2. If, conversely, the signal at MODSEL_CLKEXT is stably low over Tmin, then the internal MODE signal is switched to MODE1, as exemplified in FIG. 8.

That is to that effect, the state machine may be configured to change the mode of operation of the circuit from one to the other of the first mode of operation and the second mode of operation (e.g., changing from MODE1 to MODE 2)—only—in response to the check in the timer block (e.g., 16) indicating that the first level in the input signal (e.g., low) has been maintained over a threshold interval starting from a transition detected by the edge detector block.

Conversely, the state machine may be configured to maintain the mode of operation of the circuit at the one of the first mode of operation and the second mode of operation (e.g., maintaining MODE2) in response to the check in the timer block indicating that said second level (e.g., high) in the input signal has been maintained over said threshold interval starting from a transition detected by the edge detector block.

As exemplified herein, a method of operating a circuit (e.g., 100) having an input node (e.g., 10) configured to receive an input signal (e.g., MODSEL_CLKEXT) exhibiting transitions (e.g., rising/falling edges) between a first level and a second level, may include setting (e.g., via the signal MODE) the circuit to either one of a first mode of operation (e.g., MODE1) and a second mode of operation (e.g., MODE2) in response to the input signal having the first level or second level, respectively.

The method may further include detecting (e.g., at edge detector circuit 14) transitions between the first level and second level in the input signal, checking (e.g., at timer circuit 16) if the first level or second level in the input signal is maintained over a threshold interval (e.g., Tmin) starting from a transition detected (e.g., by edge detector circuit 14).

The method may further include changing the mode of operation of the circuit from one to the other of the first mode of operation and the second mode of operation in response to the first level or second level in the input signal being maintained over a threshold interval starting from a transition detected by the edge detector block.

A method as exemplified herein may comprise applying the signal received at the input node as a validated clock signal to the circuit in response to the input signal exhibiting a number N of transitions from one to the other of the first level and the second level and a frequency of transitions between the first level and the second level over a lower threshold value.

Although the description has been described in detail, it should be understood that various changes, substitutions, and alterations may be made without departing from the spirit and scope of this disclosure as defined by the appended claims. The same elements are designated with the same reference numbers in the various figures. Moreover, the scope of the disclosure is not intended to be limited to the particular embodiments described herein, as one of ordinary skill in the art will readily appreciate from this disclosure that processes, machines, manufacture, compositions of matter, means, methods, or steps, presently existing or later to be developed, may perform substantially the same function or achieve substantially the same result as the corresponding embodiments described herein. Accordingly, the appended claims are intended to include within their scope such processes, machines, manufacture, compositions of matter, means, methods, or steps.

The specification and drawings are, accordingly, to be regarded simply as an illustration of the disclosure as defined by the appended claims, and are contemplated to cover any and all modifications, variations, combinations, or equivalents that fall within the scope of the present disclosure.

What is claimed is:

1. A circuit, comprising:
an input node configured to receive an input signal having a first level value and a second level value; and
a logic circuit coupled to the input node and configured to receive the input signal, the logic circuit comprising:
a finite state machine circuit configured to configure a mode of operation of the circuit to a first mode of operation or a second mode of operation based on the input signal being, respectively, at the first level value or the second level value,
an edge detector circuit configured to detect a transition between the first level value and the second level value and, based thereon, communicate a corresponding transition signal to the finite state machine circuit, and
a timer circuit configured to determine whether the first level value or the second level value is maintained over a threshold interval, the threshold interval starting from a transition detected by the edge detector circuit, and wherein the finite state machine circuit is configured to change the mode of operation of the circuit based on the timer circuit determining that the first level value or the second level value has been maintained over the threshold interval.

2. The circuit of claim 1, further comprising a processing circuit, wherein the finite state machine circuit is configured to associate the input signal as a validated clock signal based on determining, by the processing circuit, that the input signal includes a number N of transitions between the first level value and the second level value and determining, by the processing circuit, that a frequency of transitions between the first level value and the second level value is greater than a lower threshold value.

3. The circuit of claim 2, wherein the finite state machine circuit is configured to:
associate the input signal as a validated clock signal, and
set the mode of operation of the circuit to, or maintain the circuit at, only one of the first mode of operation or the second mode of operation.

4. The circuit of claim 2, wherein the circuit is configured to associate the input signal as a validated clock signal for only one of the first mode of operation or the second mode of operation.

5. The circuit of claim 4, wherein the finite state machine circuit is configured to:
associate the input signal as a validated clock signal, and
set the mode of operation to, or maintain the mode of operation at, only one of the first mode of operation or the second mode of operation.

6. The circuit of claim 1, wherein the finite state machine circuit being configured to change the mode of operation of the circuit based on the timer circuit determining that the first level value or the second level value has been maintained over the threshold interval comprises:
changing the mode of operation of the circuit based on the timer circuit determining that the first level value has been maintained over the threshold interval; and
maintaining the mode of operation of the circuit based on the timer circuit determining that the second level value has been maintained over the threshold interval.

7. The circuit of claim 1, further comprising:
a counter circuit configured to determine that the input signal includes a number N of transitions between the first level value and the second level value; and
a check circuit configured to determine that a frequency of transitions between the first level value and the second level value is greater than a lower threshold value.

8. A method of operating a circuit, the method comprising:
having an input node configured to receive an input signal having a first level value and a second level value;
setting a mode of operation of the circuit to a first mode of operation or a second mode of operation based on the input signal being, respectively, at the first level value or the second level value;
detecting a transition between the first level value and the second level value;
determining whether the first level value or the second level value is maintained over a threshold interval; and
changing the mode of operation based on determining that the first level value or the second level value has been maintained over the threshold interval.

9. The method of claim 8, further comprising associating the input signal as a validated clock signal based on determining that the input signal includes a number N of transitions between the first level value and the second level value and determining that a frequency of transitions between the first level value and the second level value is greater than a lower threshold value.

10. The method of claim 9, further comprising set the mode of operation to, or maintain the mode of operation at, only one of the first mode of operation or the second mode of operation.

11. The method of claim 9, further comprising associating the input signal as a validated clock signal for only one of the first mode of operation or the second mode of operation.

12. The method of claim 11, further comprising:
determining a difference in time between two successive rising edges of the input signal; and
resetting the validated clock signal association to the input signal based on determining that the difference in time is greater than a threshold value.

13. The method of claim 11, further comprising set the mode of operation to, or maintain the mode of operation at, only one of the first mode of operation or the second mode of operation.

14. The method of claim 8, changing the mode of operation based on determining that the first level value or the second level value has been maintained over the threshold interval comprises:
changing the mode of operation based on determining that the first level value has been maintained over the threshold interval; and
maintaining the mode of operation based on determining that the second level value has been maintained over the threshold interval.

15. A system, comprising:
a clock circuit configured to generate a signal having a first level value and a second level value; and
a circuit coupled to the clock circuit and configured to receive the signal at an input of the circuit, the circuit comprising a logic circuit configured to receive the signal, the logic circuit comprising:
a finite state machine circuit configured to configure a mode of operation of the circuit to a first mode of operation or a second mode of operation based on the signal being, respectively, at the first level value or the second level value, an edge detector circuit configured to detect a transition between the first level value and the second level value and, based thereon, communicate a corresponding transition signal to the finite state machine circuit, and a timer circuit configured to determine whether the first level value or the second level value is maintained over a threshold interval, the threshold interval starting from a transition detected by the edge detector circuit, and wherein the finite state machine circuit is configured to change the mode of operation of the circuit based on the timer circuit determining that the first level value or the second level value has been maintained over the threshold interval.

16. The system of claim 15, wherein the logic circuit further comprises a processing circuit, wherein the finite state machine circuit is configured to associate the signal as a validated clock signal based on determining, by the processing circuit, that the signal includes a number N of transitions between the first level value and the second level value and determining, by the processing circuit, that a frequency of transitions between the first level value and the second level value is greater than a lower threshold value.

17. The system of claim 16, wherein the finite state machine circuit is configured to:

associate the signal as a validated clock signal, and set the mode of operation of the circuit to, or maintain the circuit at, only one of the first mode of operation or the second mode of operation.

18. The system of claim 16, wherein the circuit is configured to associate the signal as a validated clock signal for only one of the first mode of operation or the second mode of operation.

19. The system of claim 15, wherein the finite state machine circuit being configured to change the mode of operation of the circuit based on the timer circuit determining that the first level value or the second level value has been maintained over the threshold interval comprises:

changing the mode of operation of the circuit based on the timer circuit determining that the first level value has been maintained over the threshold interval; and maintaining the mode of operation of the circuit based on the timer circuit determining that the second level value has been maintained over the threshold interval.

20. The system of claim 15, wherein the logic circuit further comprises:

a counter circuit configured to determine that the signal includes a number N of transitions between the first level value and the second level value; and a check circuit configured to determine that a frequency of transitions between the first level value and the second level value is greater than a lower threshold value.

* * * * *